April 14, 1959 L. A. FEATHERS 2,882,351
NEUTRALIZED AMPLIFIER CIRCUIT
Filed Feb. 3, 1955
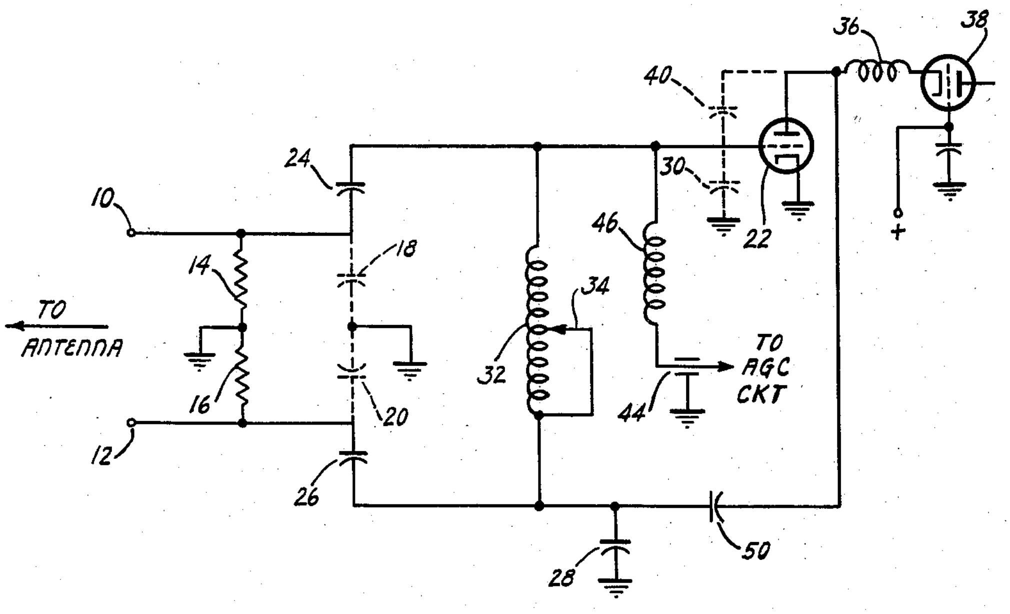
INVENTOR.
LYNN A. FEATHERS
BY
Orrin V. Hopkins
ATTORNEY United States Patent Office 2,882,351

Patented Apr. 14, 1959

2,882,351

NEUTRALIZED AMPLIFIER CIRCUIT

Lynn A. Feathers, Philadelphia, Pa., assignor to Philco Corporation, Philadelphia, Pa., a corporation of Pennsylvania Application February 3, 1955, Serial No. 486,005

8 Claims. (Cl. 179—171)

This invention relates to neutralizing means and more particularly to improved neutralizing means for amplifier stages having balanced input circuits.

Television receiver circuits operating in the very high frequency band make use of an input circuit for coupling a balanced antenna circuit to an unbalanced circuit at the grid of the first radio frequency amplifier stage. To provide a degree of selectivity to the television receiver, this input circuit is made tunable over a frequency band extending from channel 2 to channel 13. Ordinarily the tuning varies in steps corresponding to the various interchannel spacings but in some instances the tuning is continuous over the range. The transition from a balanced to an unbalanced circuit may be accomplished through the use of a balun or through the use of the novel input circuit described in the copending application of John W. Waring, Serial No. 484,177, filed January 26, 1955, and assigned to the assignee of this application. It is known that the VHF band is substantially free of atmospheric noise or static. Therefore, the maximum sensitivity of a VHF receiver is determined largely by the noise generated in the first stage of the receiver. It is customary to employ a triode as the first amplifier tube for the reason that the triode is inherently less noisy than pentodes or other multigrid tubes. However, triode tubes have the well known drawback of a relatively large anode to grid capacitance. The signal fed back to the control grid by way of this capacitance results in an increase in the apparent input capacitance of the tube. The amount of the increase is a function of the gain of the stage. This dependence of the input capacitance of a triode on feedback through the anode to grid capacitance is sometimes referred to as the "Miller effect."

The input capacity of the tube is in shunt with the tuning inductor which forms a part of the input circuit. Therefore changes in gain which result from changes in AGC bias or the like cause undesirable shifts in the resonant frequency of the input stage. It is customary to neutralize the feedback through the anode to grid capacitance by applying a signal of the same phase to the side of the input circuit remote from the grid. Considerations of economy in the highly competitive market dictate that the neutralizing means should be as simple and as cheap as possible. In the past the neutralizing means has taken the form of a single capacitor connected from the anode of the first amplifier tube to the side of the balanced circuit opposite the grid. This arrangement has the disadvantage that the amount of neutralization is a function of frequency. If the capacitor is chosen so as to provide sufficient neutralization at channel 13, for example, the circuit will be over-neutralized at channel 2. This variation of the neutralization with changes in frequency is due in part to changes in the impedance of various circuit elements and in part to changes in the stray capacitances resulting from mechanical changes in the tuning inductor as it is adjusted to change the tuning of the input circuit. If the circuit is over-neutralized the resonant frequency of the input circuit tends to shift lower in frequency as the bias on the grid of the input stage is increased. If the circuit is under-neutralized the resonant frequency of the input circuit tends to shift to a higher frequency as the bias on the input stage is increased. The bias on the input stage is usually controlled by the automatic gain control circuit and under typical conditions may vary from one-half a volt to six or eight volts depending upon the strength of the received signals. A shift of this amount in the bias will produce a shift in the tuning of the input stage which is greater than can be tolerated, particularly in color television receivers.

Therefore it is an object of the present invention to provide a simple, economical and effective neutralizing circuit for selective input stages of receivers.

A further object of the invention is to provide a frequency insensitive neutralizing means for selective input circuits which does not require the use of additional circuit elements.

In general, controlled neutralization of a balanced input circuit is achieved by connecting a neutralizing capacitor from the anode of the vacuum tube associated with the input circuit to the side of the balanced input circuit remote from the grid. This side of the input circuit is returned to ground through a capacitor having a value substantially equal to the input capacitance of the amplifier tube. The grid of the amplifier tube is returned to the source of bias potential through a radio frequency choke selected to have an inductance that will resonate with the input capacitance of the amplifier stage at a frequency below the lowest frequency to which the input circuit is to be tuned. This resonant circuit causes the variation with frequency of the feedback through the anode to grid capacitance to follow the variation with frequency of the signal fed back through the neutralizing capacitor. The equalization of these variations on the two halves of the balanced circuit eliminates any tendency for the resonant frequency of the input circuit to change with changes in the grid bias.

For a better understanding of the invention, together with other and further objects thereof, reference should now be made to the following detailed description which is to be read in conjunction with the accompanynig drawing which is a schematic diagram of a preferred embodiment of the invention.

The drawing shows an input circuit employing a capacitor transformer circuit of the type described and claimed in the above-mentioned copending application of John W. Waring for providing a transition from a balanced antena circuit to the unbalanced grid-cathode circuit of the first stage. This capacitor transformer circuit also causes the apparent source impedance to vary as a function of frequency. While the present invention is well suited for use in the circuits shown in the above-mentioned co-pending application, it may also be used in connection with more conventional balun type input circuits.

Turning now to the drawing, terminals 10 and 12 represent the terminals to which the antenna circuit is connected. The antenna circuit may comprise a conventional 300 ohm folded dipole antenna and matching 300 ohm lead in. The two conductors of the lead in are connected to terminals 10 and 12, respectively. Resistors 14 and 16 are connected from terminals 10 and 12, respectively, to ground in order to provide a direct current path to ground from the two halves of the antenna. The resistance of resistors 14 and 16 should be large enough to prevent any appreciable loading of the input circuit. In shunt with resistors 14 and 16 is the stray capacitance of the antenna circuit represented by capacitors 18 and 20. In a television tuner employing an inductor which is tunable in steps corresponding to the various channels assigned to television broadcasting the stray capacitances of the input circuit may be augmented by capacitances to ground in the switch employed to accomplish this tuning.

Terminal 10 is connected to the control grid of the first amplifier tube 22 through a series capacitor 24. Terminal 12 is returned to ground through capacitors 26 and 28. Capacitor 28 is made equal to the input capacitance 30 of tube 22 in order to maintain the balance with respect to ground of the antenna circuit. Capacitor 26 is made equal to capacitor 24 for the same reason. A tuning inductor 32 is connected in shunt with the series combination of capacitors 24 and 26 and the stray capacitances 18 and 20. Inductor 30 has been shown as having a shorting tap 34 which is employed to effect changes in inductance. In the usual form of television input circuits inductor 32 comprises a series of individual inductors connected between appropriate contacts on a rotary switch. Tap 34 short circuits appropriate taps on the tuning inductor to one end thereof in order to change the effective inductance. The adjustment of tap 34 permits the input circuit to be tuned to resonance at any one of the several channels assigned to television broadcasting. Other means for obtaining a variable inductance are known in the art and may be used in place of the one described above.

The anode of tube 22 is connected through a peaking inductance 36 to the cathode of a second amplifier stage 38. Peaking inductance 36 is chosen so as to resonate the $\pi$ network made up of this inductance, the output capacitance of tube 22 and the input capacitance of tube 38 at a frequency near the upper end of the tuning range. This arrangement minimizes the loading effect of these stray capacitances. If experience indicates that an objectionable amount of loading is present at lower frequencies, a second inductor (not shown) may be provided between the cathode of tube 38 and ground to resonate with the input capacitance of tube 38 at a frequency near the low end of the tunging range. The exact method of connecting the first stage to the second is not a part of the present invention. However, Fig. 1 illustrates the preferred form a low noise figure, namely, a cascode arrangement with the second stage connected as a grounded grid stage.

The operation of the circuit thus far described is described and claimed in the copending application of John W. Waring. As pointed out in greater detail in this copending application capacitors 24 and 26 in association with the stray capacitances 18 and 20 form an impedance transformer which transforms the characteristic impedance of the antenna circuit to an optimum source impedance for tube 22. It also transforms the balanced input circuit to an unbalanced circuit for driving the grid of tube 22. This form of transformer circuit has the advantage that it is less expensive, more versatile and more reliable than the more conventional balun input circuit and causes the apparent source impedance to follow more closely the optimum source impedance of tube 22 over the entire tuning range.

Tube 22 has been shown as a triode since this is the preferred form of tube of the first stage of a receiver operating in the very high frequency band. Triodes are notably free from partition noise which is present in multi-grid tubes. However, triodes have the disadvantage that there is a relatively large anode to grid capacitance represented in Fig. 1 by capacitor 40. The presence of this capacitance causes the apparent input capacitance of tube 22 to vary as a function of the gain of the amplifier stage including tube 22. The gain is usually caused to vary over a relatively wide range by changing the bias on the control grid thereof to compensate for changes in amplitude of the incoming signal. This change in capacitance with bias is due, at least in part, to the well known Miller effect. It will be noted that the input capacitance 30 is in shunt with a portion of tuning inductor 32. Therefore, unless the input circuit is properly neutralized, the resonant frequency of the input circuit will vary as a function of the grid bias on tube 22. In the preferred form of the invention grid bias is supplied to tube 22 from an automatic gain control circuit through blocking inductor 46. A feed through capacitor 44 is provided for maintaining the lower end of inductor 46 at ground potential for signals at any of the frequencies to which the input circuit may be tuned. A neutralizing signal is fed from the anode of tube 22 to the lower end of tuning inductor 32 through a neutralizing capacitor 50. The function of capacitor 50 is to feed back to the lower side of the balanced input circuit a signal which is equal in magnitude and in the same phase as the signal fed back to the grid through the anode to grid capacitance 40. Generally capacitor 50 will be selected to provide proper neutralization at the higher end of the range of frequencies to which the input circuit may be tuned. It has been discovered that the tendency of a circuit of this type to over-neutralize at th lower frequencies can be overcome by tuning inductor 46 to resonate with the input capacitance of tube 22 at a frequency just below the band over which the input circuit is to be tuned. While I do not wish to be limited by any theoretical explanation of this discovery, it is at present believed that the tendency to over-neutralize results from the fact that the impedance to ground from the lower end of the balanced circuit increases more rapidly than the impedance to ground from the grid of tube 22. This may be due in part to an increase in the effective input capacitance of tube 22 resulting from one or more of several causes, and in part to a decrease in the stray capacitances shunting capacitor 28. One possible cause for an increase in the effective output capacitance as the frequency decreases is the decrease in the effect of lead inductance in the input circuit. A second cause is the increase in the stray capacitance to ground from the grid side of the balanced network and a corresponding decrease in the stray capacitance to ground from the lower side of the balanced network resulting from the mechanical changes in tuning inductor 34 employed to effect the variation in tuning from the high frequency end of the tuning range to the low frequency end. At the high frequency end of the tuning range very little inductance is required and tap 34 is near the upper end of inductor 32. This places most of the stray capacitance to ground of inductor 32 in shunt with capacitor 28. As tap 34 is moved toward the lower end of coil 32, less stray capacitance appears in shunt with capacitor 28 and more appears in shunt with capacitance 30. The result is that the impedance across which the neutralizing signal is developed increases and the impedance across which the internal feedback is developed decreases as the frequency to which the circuit is tuned decreases. This results in a larger signal being developed across capacitor 28 than is fed back through the grid to plate capacitance.

I have discovered that, by choosing choke 46 to have a value that will resonate with the input capacitance 30 at a frequency just below the input range to which the circuit is to be tuned, the impedance of the grid circuit may be increased at the lower frequencies, thereby causing the feedback voltage from tube 40 to be developed across a higher impedance. This counteracts the tendency of the circuit to over-neutralize as the frequency is decreased and renders the tuning of the circuit of Fig. 1 substantially independent of the bias supplied to the control grid of tube 22. Again, without limiting the invention to particular values it has been found that tuning inductor 46 to resonate with the stray capacitance somewhere in the range of frequencies assigned to channel 1 will give satisfactory control of the neutralization at the lower end of the frequency range starting with channel 2.

The undersired shift in the stray capacitance to ground as the circuit is tuned from one end of the band to the other is found in practically all forms of tuning inductors currently employed in commercial television receivers. The tendency to over-neutralize at the lower frequencies is also found in input circuits employing baluns or elevator circuits. Therefore the present invention is not limited to circuits employing capacitor transformers or a particular type of tuning inductor. It may be employed in any circuit which is similar in its general arrangement to the circuit shown in the drawing.

While the invention has been described with reference to a single embodiment thereof, it will be apparent that various modifications and other embodiments thereof will occur to those skilled in the art within the scope of the invention. Accordingly I desire the scope of my invention to be limited only by the appended claims.

What is claimed is:

1. A neutralized amplifier stage comprising an electron tube having at least an anode, a cathode, and a control grid, said cathode being returned to a point of fixed reference potential, an input circuit tunable over a preselected range and having first and second input terminals to which a source of signals may be connected and first and second output terminals, said first output terminal being connected directly to said control grid at the frequencies of the signals to be amplified, a capacitor connected between said second output terminal and said point of reference potential, neutralizing means connected from the anode of said tube to said second output terminal, a blocking inductor connecting said control grid to a source of bias potential, said blocking inductor being chosen to have an inductance which resonates with effective capacitance in shunt therewith at a frequency slightly below said preselected range.

2. A neutralized amplifier stage comprising a triode electron tube having an anode, a cathode, and a control grid, said cathode being returned to a point of fixed reference potential, an inpuit circuit tunable over a preselected range and having first and second input terminals to which a balanced source of signals may be connected and first and second output terminals, the impedance to ground from said first and second input terminals being substantially the same for both of said terminals, said first output terminal being connected directly to said control grid at the frequencies of the signals to be amplified, a capacitor connected between said second output terminal and said point of reference potential, said capacitor having a capacitance substantially equal to the input capacitance of said tube, a neutralizing capacitor connected from the anode of said tube to said second output terminal, said neutralizing capacitor having a value such as to substantially neutralize the feedback through the anode to grid capacitance of said electron tube at frequencies above the mid-point of preselected range, a blocking inductor connecting said control grid to a source of bias potential, said blocking inductor being chosen to have an inductance which resonates with effective capacitance in shunt therewith at a frequency slightly below said preselected range.

3. An amplifier stage with compensated neutralization comprising a triode electron tube having an anode, a cathode, and a control grid, said cathode being returned to a point of fixed reference potential, a tuning inductor having one end thereof connected directly to said grid and a second end thereof connected to a point of fixed reference potential through a first capacitor, said first capacitor having a capacitance substantially equal to the input capacitance of said tube, said tuning inductor being capable of tuning said amplifier stage over a preselected frequency range, impedance transformer means having first and second input means to which a signal source may be connected and first and second output terminals connected to first and second ends, respectively, of said tuning inductor, a neutralizing capacitor connected between said anode and said second end of said tuning inductor, said neutralizing capacitor having a value such as to neutralize the feedback through the anode to grid capacitance of said tube at the higher frequency end of said tuning range, a blocking inductor connected between said control grid and a source of bias potential, said blocking inductor having an inductance which resonates with effective capacitance in shunt therewith at a frequency slightly below said frequency range, said frequency of resonance being selected to cause said neutralization to be substantially constant over said tuning range.

4. A neutralized amplifier stage comprising an electron tube having at least an anode, a cathode and a control grid, said cathode being connected to a point of reference potential at the frequencies of the signals to be amplified, an input circuit comprising inductive means and capacitive means connected together for parallel resonance, said inductive means including means for providing different amounts of inductance in circuit with said capacitive means for selectively tuning the frequency of parallel resonance to different desired frequencies within a preselected range, means for coupling a signal to be amplified to said input circuit, means connecting a first terminal of said inductive means directly to said control grid at the frequencies of the signals to be amplified, a capacitor connected between the second terminal of said inductive means and said point of reference potential, neutralizing means connected from the anode of said tube to said second terminal of said inductive means, a blocking inductor connecting said control grid to a source of bias potential, said blocking inductor being chosen to have an inductance which resonates with the effective capacitance in shunt therewith at a frequency slightly below said preselected range.

5. A neutralized amplifier stage as in claim 4 wherein said capacitor connected between said second terminal of said inductor and said point of reference potential has a capacitance substantially equal to the input capacitance of said tube.

6. A neutralized amplifier stage comprising an electron tube having at least an anode, a cathode and a control grid, said cathode being returned to a point of fixed reference potential, an input circuit comprising inductive means and capacitive means connected together for parallel resonance, said inductive means including means for providing different amounts of inductance in circuit with said capacitive means for selectively tuning the frequency of parallel resonance to different desired frequencies within a preselected range, means for coupling a signal to be amplified to said input circuit, means connecting a first terminal of said inductive means directly to said control grid at the frequencies of the signals to be amplified, a capacitor connected between the second terminal of said inductive means and said point of reference potential, said capacitor having a capacitance substantially equal to the input capacitance of said tube, a neutralizing capacitor connected from the anode of said tube to said second terminal of said inductive means, said neutralizing capacitor having a value such as to substantially neutralize the feedback through the anode to grid capacitance of said electron tube at frequencies above the mid-point of said preselected range, a blocking inductor connecting said control grid to a source of bias potential, said blocking inductor being chosen to have an inductance which resonates with effective capacitance in shunt therewith at a frequency slightly below said preselected range.

7. A neutralized amplifier stage in accordance with claim 6 wherein said input circuit is tunable over the frequency range assigned to television channels 2 through 13 and wherein said blocking inductor is chosen to have an inductance which resonates with the effective capacitance in shunt therewith at a frequency approximately equal to a frequency assigned to television channel 1.

8. A neutralized amplifier stage comprising a triode electron tube having an anode, a cathode and a control grid, said cathode being returned to a point of fixed reference potential, inductive means having first and second terminals, capacitive means comprising at least three capacitive elements connected in series combination, said inductive means and said series combination of capacitive means being connected together for parallel resonance, said inductive means including means for providing different amounts of inductance in circuit with said series combination of capacitive means for selectively tuning the frequency of parallel resonance to different desired frequencies within a preselected range, first and second input terminals connected to spaced points on said series combination of capacitive means, the capacitance from said first input terminal to said first terminal of said inductive means being substantially equal to the capacitance from said second input terminal to said second terminal of said inductive means, additional capacitive means connected between a first terminal of said inductive means and said point of fixed reference potential, said additional capacitive means having a capacitance substantially equal to the input capacitance of said tube, neutralizing capacitor connected between said anode and said second end of said inductive means, said neutralizing capacitor having a value such as to neutralize the feedback through the anode to grid capacitance of said tube at the higher frequency end of said preselected range, a blocking inductor connected between said control grid and a source of bias potential, said blocking inductor having an inductance which resonates with effective capacitance in shunt therewith at a frequency slightly below said frequency range, said frequency of resonance being selected to cause said neutralization to be substantially constant over said tuning range.

References Cited in the file of this patent

UNITED STATES PATENTS

| | | |
|---|---|---|
| 1,930,339 | Dome | Oct. 10, 1933 |
| 1,938,664 | Moulton | Dec. 12, 1933 |
| 2,199,820 | Gannett | May 7, 1940 |
| 2,540,817 | Forster | Feb. 6, 1951 |
| 2,778,934 | Tongue | Jan. 22, 1957 |

UNITED STATES PATENT OFFICE

CERTIFICATE OF CORRECTION

April 14, 1959

Patent No. 2,882,351

Lynn A. Feathers

It is hereby certified that error appears in the printed specification of the above numbered patent requiring correction and that the said Letters Patent should read as corrected below.

Column 2, line 49, for "antena" read -- antenna --; line 54, for "co-pending" read -- copending --; column 3, line 38, for "tunging" read -- tuning --; line 41, for "form a" read -- form for --; column 4, line 20, for "th" read -- the --; line 33, for "output" read -- input --; line 74, for "undersired" read -- undesired --; column 7, line 18, for "first" read -- second --; column 8, line 1, before "neutralizing" insert -- a --; line 2, for "end" read -- terminal --.

Signed and sealed this 1st day of September 1959.

(SEAL)

Attest:

KARL H. AXLINE

Attesting Officer

ROBERT C. WATSON

Commissioner of Patents